United States Patent [19]

Fukuta et al.

[11] Patent Number: 4,678,644

[45] Date of Patent: Jul. 7, 1987

[54] APPARATUS AND METHOD FOR PLASMA TREATMENT OF RESIN MATERIAL

[75] Inventors: Kenji Fukuta; Takaoki Kaneko; Yoshinobu Takahashi, all of Toyota, Japan

[73] Assignee: Toyota Jidosha Kabushiki Kaisha, Japan

[21] Appl. No.: 825,941

[22] Filed: Jan. 30, 1986

Related U.S. Application Data

[63] Continuation of Ser. No. 583,207, Feb. 24, 1984, abandoned.

[30] Foreign Application Priority Data

| Feb. 25, 1983 | [JP] | Japan | 58-29370 |
| Apr. 13, 1983 | [JP] | Japan | 58-63733 |
| Apr. 13, 1983 | [JP] | Japan | 58-63734 |
| Apr. 13, 1983 | [JP] | Japan | 58-63735 |
| Jun. 28, 1983 | [JP] | Japan | 58-115273 |
| Jun. 28, 1983 | [JP] | Japan | 58-115274 |
| Jul. 25, 1983 | [JP] | Japan | 58-134416 |

[51] Int. Cl.$^4$ .................................................. B01J 19/08
[52] U.S. Cl. ........................... 422/186.05; 422/186.04; 156/345; 118/723
[58] Field of Search ............... 422/186.05, 186.06; 156/345; 118/723

[56] References Cited

U.S. PATENT DOCUMENTS

| 4,065,369 | 12/1977 | Ogawa et al. | 422/186.05 |
| 4,096,822 | 6/1978 | Yamawaki | 118/500 |
| 4,151,034 | 4/1979 | Yamamoto et al. | 156/345 |
| 4,160,690 | 7/1979 | Shibagaki et al. | 422/186.05 |

Primary Examiner—Richard Bueker
Attorney, Agent, or Firm—Finnegan, Henderson, Farabow, Garrett & Dunner

[57] ABSTRACT

An apparatus for plasma treatment, capable of plasma-treating works of resin material by irradiating the surfaces of the works with a microwave discharge plasma within a vacuum reaction chamber, comprises a plurality of long plasma-irradiating tubular pipes, each of which is provided along the length thereof with numerous small holes for injecting plasma, and at least one plasma-irradiating straight pipe disposed with its free end opening toward a section to which the plasma is hard to flow. At least one second plasma-irradiating pipe is located movably to an optional position within the reaction chamber. A method for surface plasma-treatment comprises dividing a microwave generated in a magnetron in a plurality of microwaves by a distributor, introducing the divided microwaves into a plurality of plasma generating mechanisms, respectively, and introducing plasmas generated in the respective plasma generating mechanisms into the reaction chamber through a plurality of plasma introducing ports, respectively, formed in the wall of the reaction chamber.

9 Claims, 36 Drawing Figures

O: VALVE OPEN   S: VALVE CLOSED
$T_1: t_1 - 0$   $T_2: t_2 - t_3$

APPARATUS AND METHOD FOR PLASMA TREATMENT OF RESIN MATERIAL

This application is a continuation of application Ser. No. 583,207 filed Feb. 24, 1984, now abandoned.

FIELD OF THE INVENTION

This invention relates to an apparatus and method for the plasma treatment of the surfaces of work made of resin material, such as those made of polypropylene resin (PP) or polyethylene resin (PE), for reforming the surface thereof. And this invention is particularly effective in the surface pretreatment when painting comparatively large and complicated resin parts.

BACKGROUND OF THE INVENTION

It is a recent trend in industries, especially in the automobile industry, for instance, to use resin parts which are lightweight and superior in designing flexibility. However, the application of comparatively inexpensive PP or PE resin to exterior panels of vehicles, for instance, entails a problem that the adhesion of paint films to the surfaces of resin panels is not so good and the paint films are likely to peel off the surfaces. Treatment of surfaces with plasma has been known as a means for solving the above-mentioned problem. In plasma treatment, the surfaces of PP or PE resin parts are subjected to corona, or glow discharge treatment or to radio or microwave discharge treatment to oxidize (introduction of polar groups) or to etch (improvement of the anchoring effect) the surfaces.

On the other hand, in plasma treatment, it is necessary to evacuate or to reduce the pressure of the reaction chamber in order to enhance the effect of treatment (to extend the life of plasma). Accordingly at the present a batch process is employed in most cases for plasma treatment.

In applying the batch system of plasma treatment process to the production of automotive parts, namely, to a mass production process, it is required that the reaction chamber be rapidly evacuated in a short period of time and the number of parts which can be subjected to plasma treatment in one batch cycle is increased. However, the conventional apparatus for plasma treatment has a problem that the parts are plasma-treated differently among the parts as well as within each part depending on the disposition of the parts in the reaction chamber, since automotive parts are large and complicated in configuration.

SUMMARY OF THE INVENTION

This invention is to provide a method and apparatus for plasma treatment, which method and apparatus are capable of solving the above-mentioned problems and of uniformly plasma-treating numerous comparatively large parts of complicated configuration at the same time.

Accordingly, it is a primary object of this invention to provide a method and an apparatus for plasma treatment, which method and apparatus are capable of establishing the uniform distribution of plasma density within a reaction chamber so that a plurality of parts placed in the reaction chamber are treated to the same extent regardless of the disposition and so that the individual parts are treated uniformly over the entire surfaces thereof regardless of the configuration thereof.

According to this invention, there is provided an apparatus for plasma treatment, capable of plasma-treating works of resin material by irradiating the surfaces of the works with a microwave discharge plasma within a vacuum reaction chamber, comprising a plurality of long plasma-irradiating tubular pipes, each of which is provided along the length thereof with numerous small holes for injecting plasma, and at least one plasma-irradiating straight pipe disposed with its free end opening toward a section to which the plasma is hard to flow.

Furthermore, according to this invention, there is provided an apparatus for plasma treatment, capable of plasma-treating works of resin material by irradiating the surfaces of the works with a microwave discharge plasma within a vacuum reaction chamber, comprising at least one first plasma-irradiating pipe fixed to the inner wall of the reaction chamber, and at least one second plasma-irradiating pipe located movably to an optional position within the reaction chamber.

Further, there is provided a method for surface plasma-treatment, capable of plasma-treating works of resin material, by generating a microwave discharge plasma at the outside of a reaction chamber, introducing the plasma into the reaction chamber, and irradiating the plasma on the works to be treated, comprising dividing a microwave generated in a magnetron in a plurality of microwaves by a distributor, introducing the divided microwaves into a plurality of plasma generating mechanisms, respectively, each including a plasma generating furnace and a plasma generating pipe, and introducing plasmas generated in the respective plasma generating mechanisms into the reaction chamber through a plurality of plasma introducing ports, respectively, formed in the wall of the reaction chamber.

DETAILED DESCRIPTION OF THE PREFERRED EMBODIMENTS

Before describing preferred embodiments of the present invention in detail, a comparable sample will be described hereunder.

Figure 1:
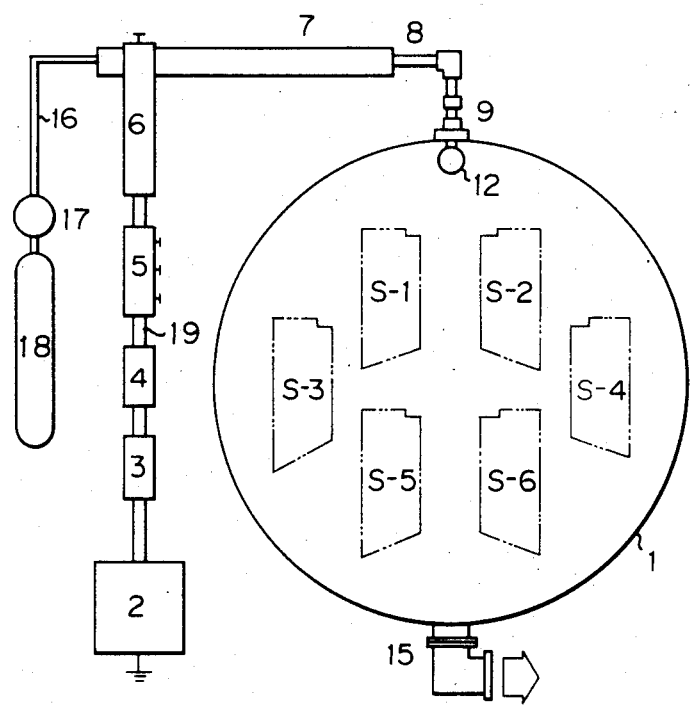
FIG. 1 is a schematic sectional view of a plasma treatment apparatus shown for comparison.

FIG. 1 is a schematic illustration of a microwave discharge plasma treatment apparatus of a comparable example. Resin parts used for motor vehicles were subjected to surface treatment in this plasma treatment apparatus. The degree of surface was not uniform, among the parts as well as among the positions within each part, due to the large size and the complicated configuration of those parts.

In FIG. 1, there are shown a reaction chamber 1, a microwave oscillator 2, an isolator 3 (Toshiba Corp.), a power monitor 4 (Toshiba Corp.), a three-stab tuner 5 (Toshiba Corp.), a plasma generating furnace 6, a plasma generating pipe 7, a quartz pipe 8, a plasma introducing port 9, a plasma-irradiating pipe 12, a discharge port 15 for evacuating the reaction chamber, a gas supply conduit 16, a flow meter 17, a gas bomb 18, a waveguide 19 and sample works S1 to S6.

Preparatory experiments were carried out in the following manner to acquire data for solving the above-mentioned problems residing in the microwave discharge plasma treatment apparatus of a comparable example in FIG. 1.

Procedure of the Preparatory Experiments (PP resin sample works)

Figure 2:
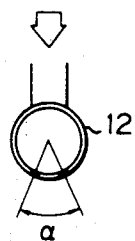
FIG. 2 is a schematic sectional view of the glass pipe of the apparatus of FIG. 1, as improved for preparatory experiments.
Figure 3:
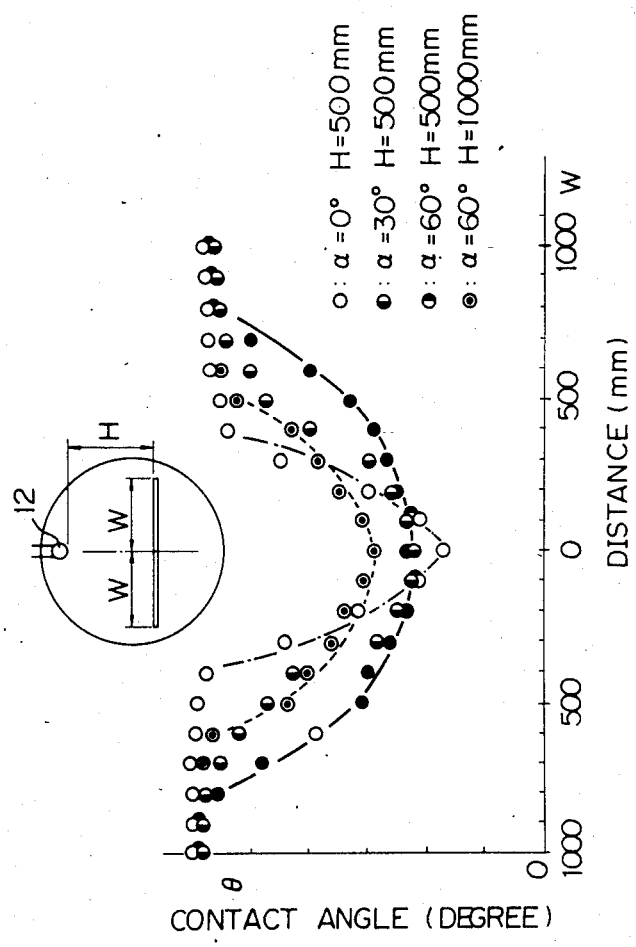
FIG. 3 is a graphical representation of the results of the preparatory experiments.
Figure 11:
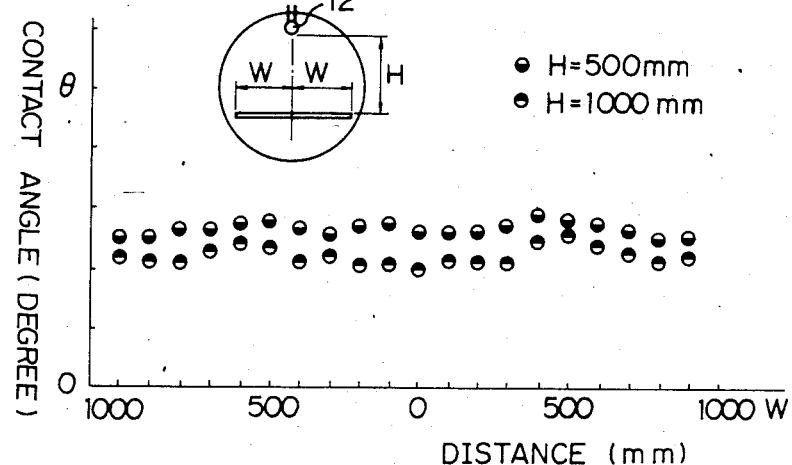
FIG. 11 is a graphical representation of the results of experimental plasma treatment according to the present invention.

[Reaction Chamber]
  Cylindrical chamber: 2000 mm diameter ×2000 mm length
[Conditions of Treatment]
  Frequency of microwave : 2450 MHz
  Output capacity : 500 W
  Degree of vacuum : 0.5 Torr
  Working gas (flow rate): Oxygen gas (5000 cc/min)
  Duration of treatment : 30 sec
[Plasma-Irradiating Pipe]
  Plasma injection angle $\alpha$ of the glass pipe 12: 0°, 30°, 60° (refer to FIGS. 2 and 11)
[Disposition of Sample Works]
  The sample works were so located that the distance H between the plasma injection nozzle made of the glass pipe 12 and the surfaces of the sample works, along the bisector of the angle $\alpha$, was 500 mm or 1000 mm, as illustrated in FIG. 11. The contact angle of the plasma-treated surface of the sample works was measured, at positions on opposite sides and at a distance W (W=0 to 1000 mm), with respect to the point from the distance H of the intersection of the bisector of the plasma injection angle. Measured results are shown in FIG. 3.
[Contact Angle Measuring Method]
  Demineralized water of 5 $\mu$l in quantity was dropped on the plasma-treated surface of the PP resin sample works. A contact angle measuring instrument (Kyowa Kagaku, Model: CA-A) was used for the measurement of the contact angle. The ambient air conditions were 20° C. and 50 to 60% RH.

The results of the preparatory experiments (FIG. 3) showed that:

(1) The life of the plasma introduced into the reaction chamber 1 is dependent on the distance between the plasma injection nozzle of the glass pipe 12 and the sample work; and (2) The diffusion of the plasma introduced into the reaction chamber 1 is dependent on the position (and/or angle α) of the plasma injection nozzle of the glass pipe 12.

Although not shown in FIG. 3, in addition to the facts explained in Paragraphs 1) and 2) described above, it was found that the plasma treatment was affected by the screening effect of the work affects. These are deemed to be attributable to the irregular distribution of the plasma density within the reaction chamber.

Figure 4:
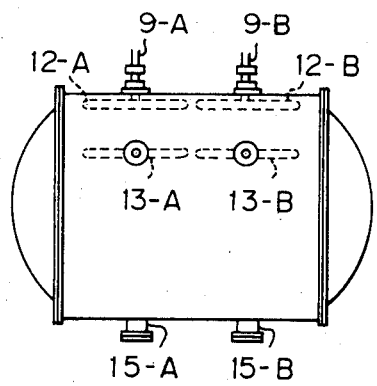
FIG. 4 is a side elevation of a first embodiment of a plasma treatment apparatus according to the present invention.
Figure 5:
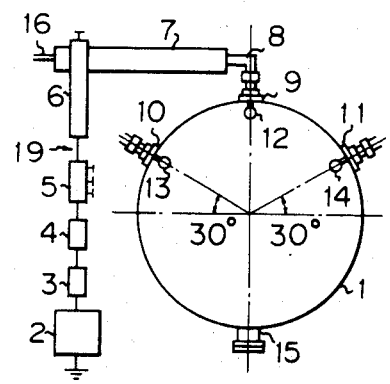
FIG. 5 is a schematic sectional view of the apparatus of FIG. 4.
Figure 8:
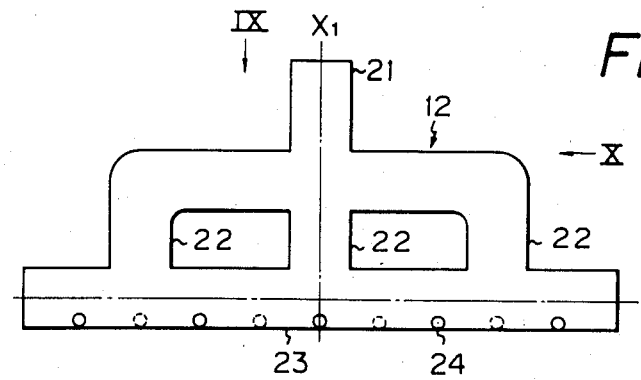
FIG. 8 is a front elevation of a glass pipe employed in the apparatus of the present invention.
Figure 9:
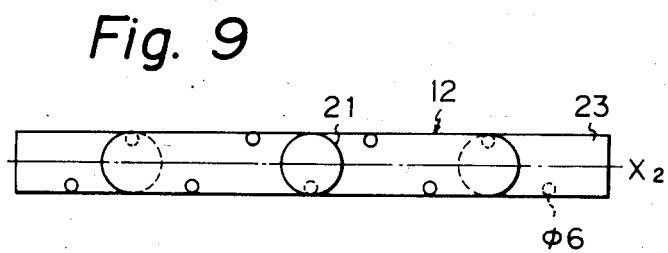
FIG. 9 is a view taken in the direction of the arrow IX in FIG. 8.
Figure 10:
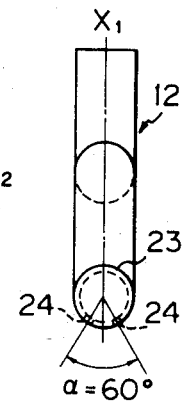
FIG. 10 is a view taken in the direction of the arrow X in FIG. 8.

FIGS. 4 and 5 illustrates a first embodiment of a plasma treatment apparatus according to the present invention. In this embodiment, the reaction chamber 1 is of a circular cylinder. Referring to FIGS. 4 and 5, there are shown a cylindrical reaction chamber 1 of 1000 mm or more in diameter, a microwave oscillator 2, an isolator 3 (Toshiba Corp.), a power monitor 4 (Toshiba Corp.), a three-stab tuner 5 (Toshiba Corp.), a plasma generating furnace 6, a plasma generating tube 7, a quartz tube 8, plasma introducing ports 9 (9-A, 9-B), 10 and 11, plasma-irradiating pipes 12 (12-A, 12-B), 13 (13-A, 13-B) and 14, exhaust ports 15 (15-A, 15-B) for evacuating the reaction chamber 1, a gas supply conduit 16 and a waveguide 19. The microwave generated by the oscillator 2 is guided through the isolator 3, the power monitor 4 and the three-stab tuner 5 to the plasma generating furnace 6 by the waveguide 19. On the other hand, a gas to be converted into a plasma is supplied through the conduit 16 to the plasma generating pipe 7. The plasma generated in the plasma generating pipe 7 and the plasma generating tube 7 is sent to the plasma introducing ports 9-A, 9-B, 10-A, 10-B, 11-A and 11-B. In the first embodiment, the three pairs of the plasma introducing ports 9, 10, and 11 are arranged on the three generatrices of the reaction chamber 1 which are separate from each other by an angular interval of 60° respectively. The plasma sent to the plasma introducing ports is injected into the reaction chamber 1 by the plasma-irradiating pipes 12-A, 12-B, 13-A, 13-B, 14-A and 14-B connected to the plasma introducing ports 9-A, 9-B, 10-A, 10-B, 11-A and 11-B respectively. The details of plasma injection nozzles formed in the plasma-irradiating pipes are illustrated in FIGS. 8 to 10. Since the reaction chamber 1 needs to be evacuated to a degree of vacuum of approximately 1.0 to 0.05 Torr for plasma treatment, the reaction chamber 1 is evacuated continuously by a vacuum pump (not shown), connected through pipes (not shown) to the exhaust ports 15.

Figure 6:
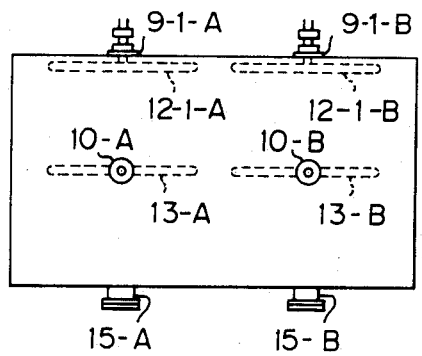
FIG. 6 is a side elevation of a second embodiment of a plasma treatment apparatus according to the present invention.
Figure 7:
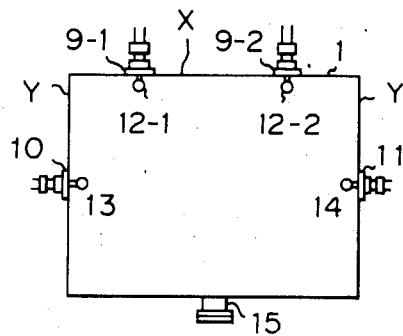
FIG. 7 is a schematic sectional view of the apparatus of FIG. 6.

FIGS. 6 and 7 show a second embodiment of a plasma treatment apparatus according to the present invention. In this embodiment, the reaction chamber 1 is formed in the form of a rectangular prism having sides each of 1000 mm or more in length. Same or corresponding parts are indicated by same or corresponding reference numerals through the first and the second embodiments. The size of the reaction chamber 1 in the form of a rectangular prism is, for example, that X indicated in FIG. 7 is 2500 mm which is the width of a wall provided with plasma introducing ports 9-1 and 9-2, Y also indicated in FIG. 7 is 1800 mm which is the width of walls provided with plasma introducing ports 10 and 11. A plurality of the plasma introducing ports 9-1 and 9-2 are arranged on the wall indicated by X as illustrated in FIG. 7, at an interval of 1000 mm or less, for example, 900 mm. The other constitution and the functions of this second embodiment are the same as the first embodiment.

FIGS. 8 to 10 show plasma-irradiating pipes 12-, 13- and 14-A and B (first embodiment) or 12-1-, 12-2-A and B, 13-, 14-A and B (second embodiment) connected to the plasma introducing ports 9-, 10-, 11-A and B (first embodiment) or 9-1-, 9-2-A and B, 10-, 11-A and B (second embodiment) respectively. Desirably, the plasma-irradiating pipe 20 is formed of glass or quartz. The plasma-irradiating pipe 20 is joined at a base 21 thereof to the plasma introducing port (9, 10 or 11). A manifold 22 extends from the base 21 and a cylindrical spraying head 23 extends from the manifold 22. The spraying head 23 is formed so as to extend perpendicularly to and symmetrically with respect to the center axis $X_1$ of the corresponding plasma introducing port. The opposite ends of the spraying head 23 are closed. A plurality of plasma injection nozzles 24 of, for example, 6 mm in diameter are provided in the lower side of the spraying head 23 at fixed intervals along the longitudinal direction. The plasma injection nozzles 24 are staggered with respect to the center axis $X_2$ of the spraying head 23 as viewed in FIG. 9, so that the adjacent plasma injection nozzles are disposed on opposite sides of a plane defined by the center axes $X_1$ and $X_2$ as viewed in FIG. 10 and at an angular interval of 60° (at an angular position of 30° on each side of the plane defined by the center axes $X_1$ and $X_2$).

FIG. 11 show measured results obtained by the experimental plasma treatment of works (PP resin works) by using the apparatus of the first embodiment (FIGS. 4 and 5) employing the plasma-irradiating pipes of FIGS. 8 to 10. In this experimental plasma treatment, the plasma-irradiating pipes were disposed so that the longitudinal axes of the plasma-irradiating pipes extend along the longitudinal axis of the cylindrical reaction chamber 1 as illustrated in FIG. 4. The size of the reaction chamber, the conditions of treatment and the contact angle measuring method are the same as those of the preparatory experiments. The distance H between the plasma injection nozzle and the surface of the sample works were 1000 mm and 500 mm (H is the distance between the plasma-irradiating pipe 12 shown in FIG. 5 and the sample works). Contact angle was measured for the surface of the sample works within a range of W=0 to W =1000 mm (The definition of W in this experiment is the same as in the preparatory experiments). Other conditions of experiments were the same as the preparatory experiments mentioned before.

It is obvious from the results of the experiments as shown in FIG. 11 that the present invention is capable of establishing uniform distribution of plasma density within the reaction chamber, and capable of plasma-treating many comparatively large works of complicated configuration, simultaneously and uniformly, regardless of the location of the works, and also capable of eliminating irregular plasma treatment within each work attributable to the configuration.

Figure 12:
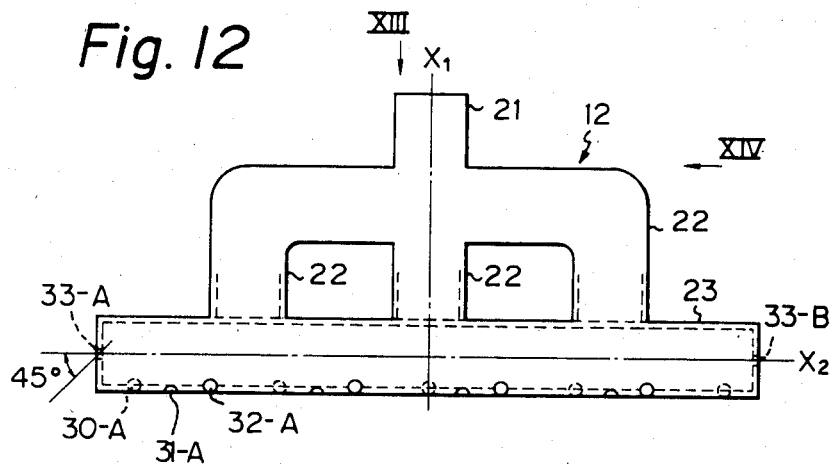
FIG. 12 is a front elevation of a glass pipe employed in a further embodiment of the present invention.
Figure 13:
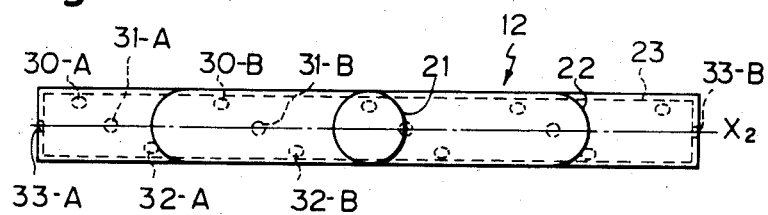
FIG. 13 is a view taken in the direction of the arrow XIII in FIG. 12.
Figure 14:
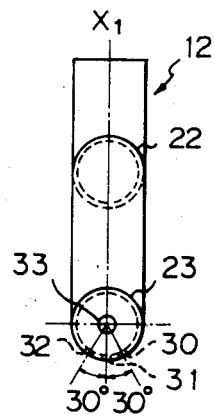
FIG. 14 is a view taken in the direction of the arrow XIV in FIG. 12.

FIGS. 12 to 14 show a second embodiment of a plasma-irradiating pipe according to the present invention. The plasma-irradiating pipe is joined coaxially at a base 21 to the plasma introducing port 9, 10 or 11 (FIGS. 4 and 5). A manifold 22 extends from the base 21 and a cylindrical spraying head ("plasma-irradiating pipe" in a narrow sense) 23 extends from the manifold 22. The plasma introducing ports 9, 10 and 11 are formed in the wall of the reaction chamber 1 as illustrated in FIGS. 4 and 5. The center axis $X_1$ of each plasma introducing port extends perpendicularly to the wall of the reaction chamber 1 (FIG. 4) and intersects the longitudinal center axis of the reaction chamber 1 (FIG. 5). The spraying head 23 is disposed in parallel to the longitudinal axis of the reaction chamber 1, with its center axis $X_2$ extending perpendicularly to the center axis $X_1$ of the corresponding plasma introducing port. The spraying head 23 extends for equal lengths on both sides with respect to the center axis $X_1$ of the corresponding plasma introducing port. That is, the cylindrical spraying head 23 extends adjacent to and in parallel to the wall of the reaction chamber.

A plurality of plasma injecting nozzles 30 with 33 are formed in the cylindrical spraying head 23. The diameter of the plasma injection nozzle is, for example, 6 mm. The plasma injection nozzles 31-A, 31-B, ... are formed in the bottom of the cylindrical spraying head 23 as viewed in FIG. 14 (in the portion of the cylindrical spraying head 23 extending farthest from the adjacent wall of the reaction chamber 1) along the longitudinal direction of the cylindrical spraying head 23 at a fixed interval (approximately 20 mm). The plasma injection nozzles 30-A, 30-B, ... and the plasma injection nozzles 32-A, 32-B, ... are disposed along the longitudinal direction of the spraying head 23 on opposite sides, respectively, of a plane including the center axis $X_1$ and the plasma injection nozzles 31-A, 31-B, ... and apart from the plasma injection nozzles 31-A, 31-B, ... by an angular interval of 7.5° to 45°, preferably, 15 to 30°, for example, 30°, at a fixed longitudinal interval as illustrated in FIGS. 13 and 14. It is desirable to dispose the plasma injection nozzles 30-A, 30-B, ..., 31-A, 31-B, ... and 32-A, 32-B, ... so as to be staggered along the longitudinal direction of the spraying head 23 as illustrated in FIGS. 12 and 13.

Plasma injection nozzles 33-A and 33-B are formed in the opposite ends of the cylindrical spraying head 23 on the center axis $X_2$. The plasma injection nozzles 33-A and 33-B are declined as viewed in FIG. 12 at an angle between 15° to 80°, preferably 30° to 60°, for example, 45°, with respect to the center axis $X_2$, namely, toward the interior of the reaction chamber 1.

FIGS. 15 to 18 show the measured results of experiments performed to confirm the effect of the abovementioned embodiments. The experiments were performed in the same manner as the experiments as described hereinbefore.

Figure 16:
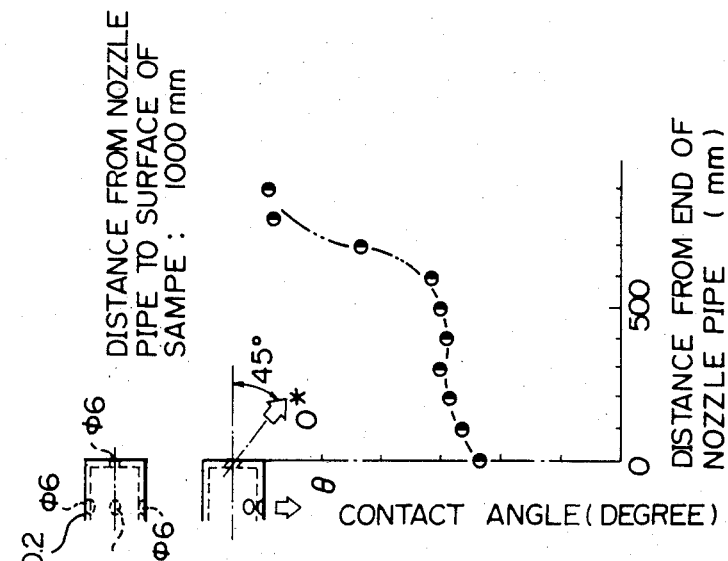
FIG. 16 is a graphical representation of the results of experiments carried out with a glass pipe embodying the present invention (a glass pipe provided with plasma radiating nozzles in the end walls)
Figure 15:
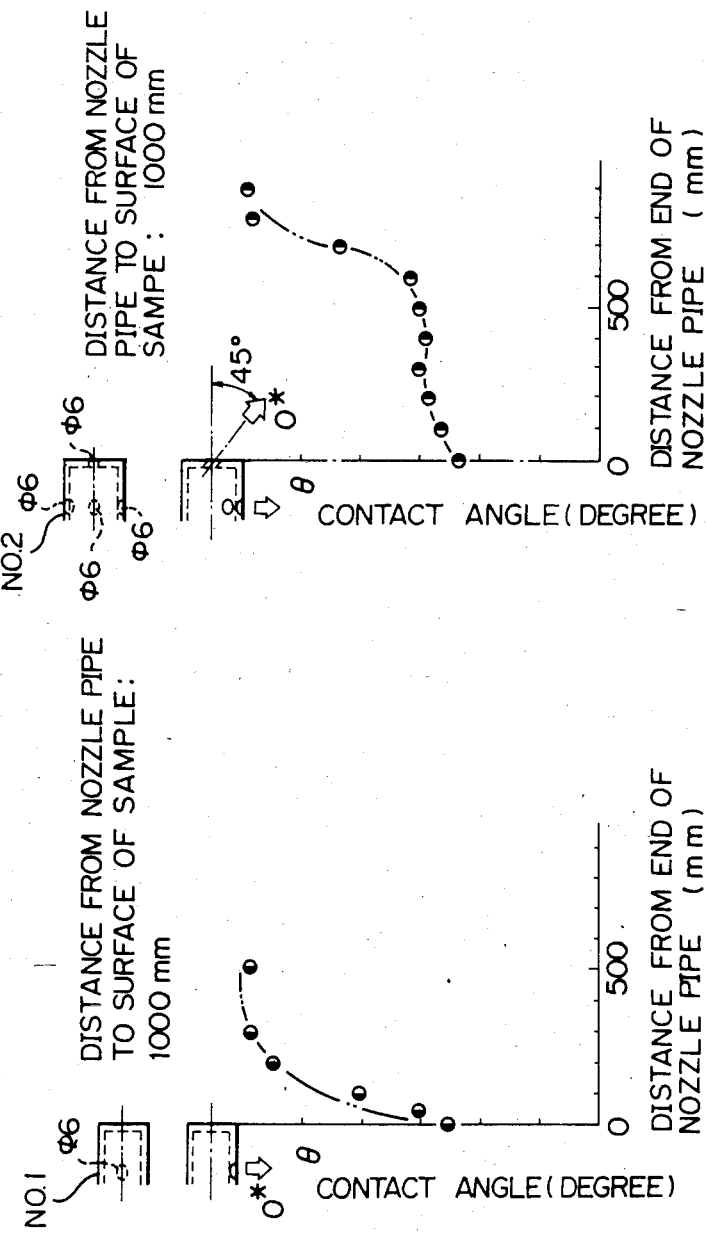
FIG. 15 is a graphical representation of the results of experiments carried out with a comparable glass pipe (a glass pipe provided with no plasma radiating nozzle in the end walls)

FIG. 15 shows experimental results of plasma treatment, in which the plasma-irradiating pipe (No. 1) having the plasma spraying head with no plasma injection nozzle in the end walls was employed for comparison. FIG. 16 shows the experimental results of plasma treatment, in which the above-mentioned embodiment of the plasma-irradiating pipe (No. 2) having the plasma spraying head provided with the plasma injection nozzles (33-A, 33-B) in the end walls thereof. In either experiment of plasma treatment, the work was placed 1000 mm away from and in parallel to the glass or nozzle pipe. In FIGS. 15 and 16, the abscissa represents the distance (mm) from the end of the glass or nozzle pipe to measuring points, while the ordinate represents measured contact angle. As is evident from the comparative examination of FIGS. 15 and 16, the provision of plasma injection nozzles in the end walls of the plasma spraying head uniformizes the distribution of plasma density within the reaction chamber.

Figure 17:
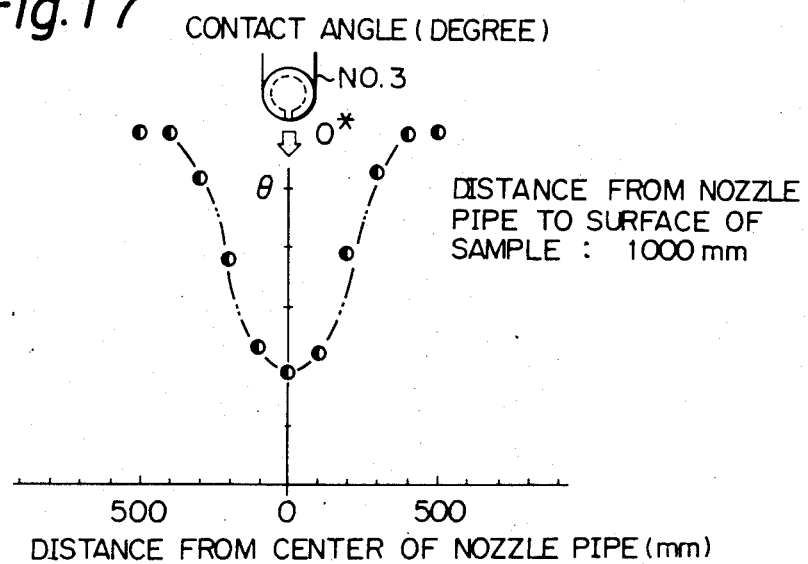
FIG. 17 is a graphical representation of the results of experiments carried out with a comparable glass pipe (a glass pipe provided only with plasma radiating nozzles 31)
Figure 18:
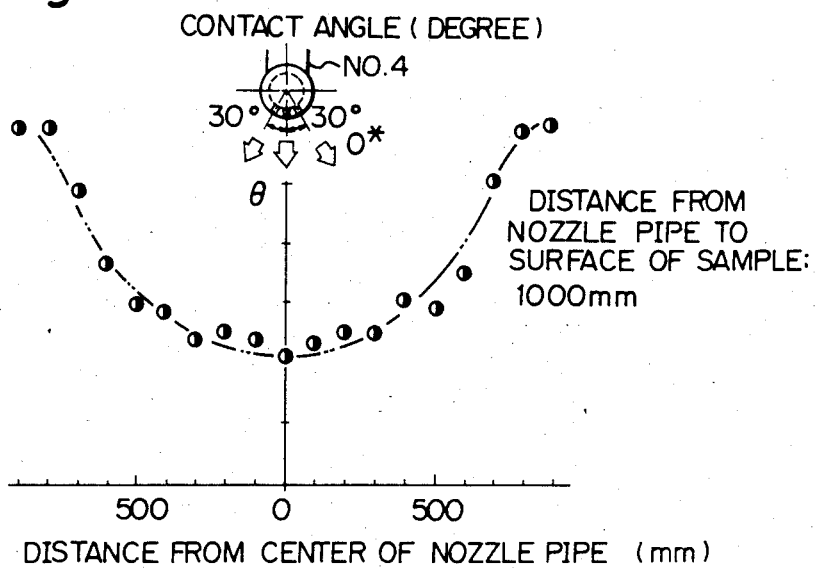
FIG. 18 is a graphical representation of the results of experiments carried out with a glass pipe embodying the present invention (a glass pipe provided with plasma radiating nozzles 30, 31 and 32)

FIG. 17 shows experimental results of plasma treatment, in which the plasma-irradiating pipe (No. 3) having the plasma injection nozzles 31 formed in the plasma spraying head within a plane including the center axes $X_1$ and $X_2$ (FIG. 14) was employed for comparison. FIG. 18 shows experimental results of plasma treatment, in which the above-mentioned plasma-irradiating pipe (No. 4) embodying the present invention, having the plasma injection nozzles 31 formed in a plane including the center axes $X_1$ and $X_2$ (FIG. 14) and plasma injection nozzles 30 and 32 formed in the same plasma spraying head outside the plane including the plasma injection nozzles 31. In either experiment of plasma treatment, the surface of a work was placed 1000 mm apart from the plasma-irradiating pipe, and contact angle was measured at measuring points on a line extending perpendicularly to the longitudinal direction of the plasma-irradiating pipe. In FIGS. 17 and 18, the abscissa represents the distance (mm) from the point of center 1000 mm apart from the plasma spraying head to the measuring point, while the ordinate represents measured contact angle. As is evident from the comparative examination of FIGS. 17 and 18, the provision of the plasma injection nozzles 30, 31, and 32 in an arrangement as illustrated in FIG. 14 uniformizes the distribution of plasma density within the reaction chamber.

Furthermore, the inventors of this invention had made a study to improve the plasma transporting pipe and the plasma-irradiating pipe of a plasma treatment apparatus based on microwave discharge system and found that those pipes could be made of a stainless steel. Such a plasma treatment apparatus is constituted to transport the plasma generated in a plasma generating pipe, for example, a quartz pipe, disposed perpendicularly to the direction of microwaves, and the plasma generated is transported through stainless conduits into a reaction chamber and to spray the plasma by an optional number of stainless steel plasma-irradiating pipes having openings facing works to be plasma-treated. It is recommended to apply Teflon ® (the trade name of polytetrafluoroethylene) connectors, such as sockets, elbows and crosses, to the joint of the plasma generating tube and the plasma transporting conduit, bends and junctions. The use of stainless steel plasma transporting conduits and stainless steel plasma-irradiating pipes provides the effect of plasma treatment which is by no means inferior to that provided by the use of quartz conduits and quarts plasma-irradiating pipes. When stainless steel conduits and stainless steel plasma-irradiating pipes are used, the plasma will not be deactivated during transportation and the plasma transporting conduits and the plasma-irradiating pipes will never be broken.

Furthermore, the component members of a plasma treatment apparatus may be made of steel and the portions of the steel members which are exposed to the plasma may be coated with a substance capable of preventing the deactivation of the plasma.

"Steel" as mentioned above designates stainless steels, for example, SUS304, and ordinary steels. "The portions of the steel members which are exposed to the plasma" as mentioned above are actually the inner surfaces of the plasma transporting conduits, the plasma generating tube, the plasma-irradiating pipes, the reaction chamber and the associated members.

A silicon resin or a fluororesin is advantageously applicable as a substance for preventing the deactivation of the plasma. A preferable fluororesin is fluorocarbon resin, for example, Teflon ® (the trade name of polytetrafluoroethylene). It is advantageous to coat the selected portions to be exposed to the plasma with approximately 10 to 50 μm thick films, preferably, approximately 25 to 40 μm thick films of the above-mentioned resin through an appropriate coating process. When a plasma treatment apparatus is thus constructed, the plasma transporting conduits and the plasma-irradiating pipes will never be broken, and hence the interruption of the operation of the production line attributable to the breakage of the component members is eliminated.

Furthermore, the substitution of expensive quartz glass pipes or Pyrex ® pipes by steel pipes provides inexpensive plasma treatment apparatus. Still further, according to this invention, the effect of plasma treatment will not be reduced and the plasma is not deactivated during transportation.

Figure 19:
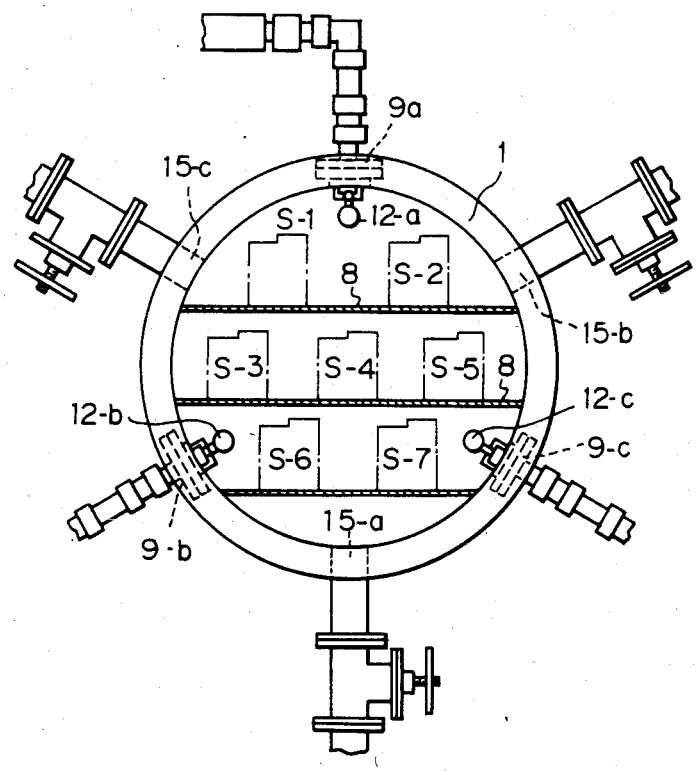
FIG. 19 is a schematic sectional view of a further embodiment of a plasma treatment apparatus according to this invention.

FIG. 19 shows a further embodiment of the present invention. Referring to FIG. 19, plasma introducing ports 9-a, 9-b and 9-c are located in the same section of a reaction chamber at an angular interval of 120° at the circumference and connected to plasma-irradiating pipes 12-a, 12-b, and 12-c respectively. The plasma-irradiating pipes 12-a, 12-b and 12-c jet plasma against works S-1 to S-7. Exhaust ports 15-a, 15-b and 15-c for regulating the degree of vacuum are located opposite the shower pipes 12-a, 12-b and 12-c respectively. The plasma introducing port 9-a and the exhaust port 15-a, the plasma introducing port 9-b and the exhaust port 15-b, and the plasma introducing port 9-c and the exhaust port 15-c, respectively, are always controlled synchronously.

Figure 20:
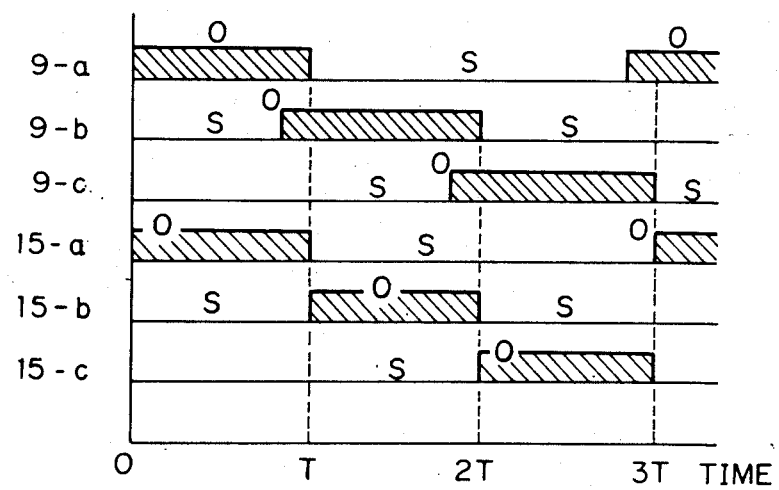
FIG. 20 is a timing chart showing the opening and closing timings of plasma introducing ports and exhaust ports respectively.

On the other hand, the timings of the corresponding plasma introducing port and the exhaust port are controlled by timers and solenoid valves so that one of the timings is delayed to the other. If two sets of plasma introducing ports and the exhaust ports should function simultaneously, most part of the plasma injected through the plasma introducing ports would be exhausted. FIG. 20 shows an exemplary timing chart of the functions of the plasma introducing ports and the exhaust ports which brought about the most uniform effect of plasma treatment in the method of plasma treatment according to the present invention.

During plasma treatment in the comparable plasma treatment apparatus (FIG. 1), the plasma tends to flow through the reaction chamber 1 only in one way from the plasma introducing port 9 toward the exhaust port 15, whereas according to the plasma treatment apparatus and method embodying the present invention, the plasma flows in various directions according to the number of the plasma introducing ports and the exhaust ports, and thereby the distribution of the plasma density in the reaction chamber is uniformized and the works are plasma-treated uniformly regardless of the location and the configuration thereof.

Figure 21:
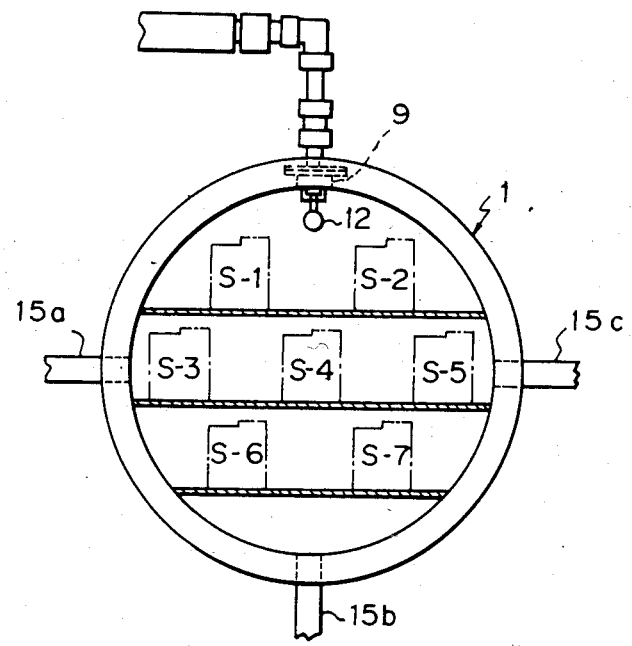
FIG. 21 is a schematic sectional view of a still further embodiment of a plasma treatment apparatus according to the present invention.
Figure 22:
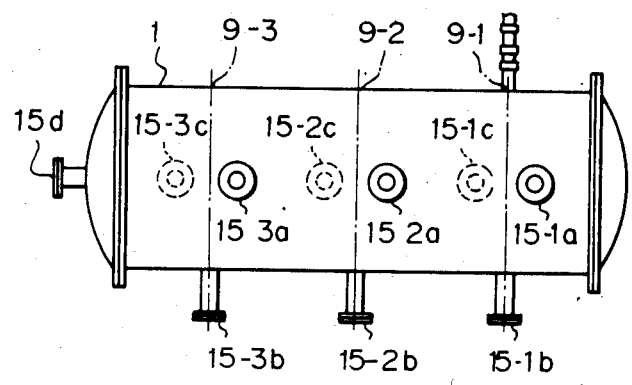
FIG. 22 is a general longitudinal sectional view of the plasma treatment apparatus of FIG. 21.

FIGS. 21 and 22 show a further embodiment of this invention. In this embodiment, exhaust ports 15-b are located opposite plasma introducing ports 9, while exhaust ports 15-a and 15-c are located at optional positions on generatrices circumferentially separated oppositely from a generatrix including the exhaust ports 15-b by an angle of 90° at the circumference (FIG. 21). That is, the exhaust ports 15-1a, 15-2a and 15-3a, the exhaust ports 15-1b, 15-2b and 15-3b and the exhaust ports 15-1c, 15-2c and 15-3c are arranged in series along the longitudinal direction of a reaction chamber respectively (FIG. 22). The exhaust ports are made to intermittently and simultaneously function or to function intermittently at different timings respectively. On the other hand, the plasma introducing ports 9 are kept open throughout the plasma treatment operation.

The plasma introducing ports 9 and the exhaust ports 15-1a to 15-1c, 15-2a to 15-2c and 15-3a to 15-3c function in suitable combinations. For example, when the exhaust ports 15-1a to 15-3a are open and the remaining exhaust ports are closed, the plasma tends to flow from the plasma introducing ports 9 toward the exhaust ports 15-1a to 15-1c The similar phenomena occur with the combinations of the plasma introducing ports 9 and the remaining exhaust ports. In another case, for example, when the three exhaust ports 15-1a, 15-1b and 15-1c are open and the remaining exhaust ports are closed, the plasma tends to flow from the plasma introducing ports 9 toward the exhaust ports 15-1a, 15-1b and 15-1c. The similar phenomena occur with the remaining exhaust ports when they are open.

The various combinations of those modes of flow of the plasma uniformize the distribution of the plasma density in the reaction chamber, and hence the works S1 to S7 are plasma-treated uniformly regardless of the location and the configuration thereof.

Figure 23:
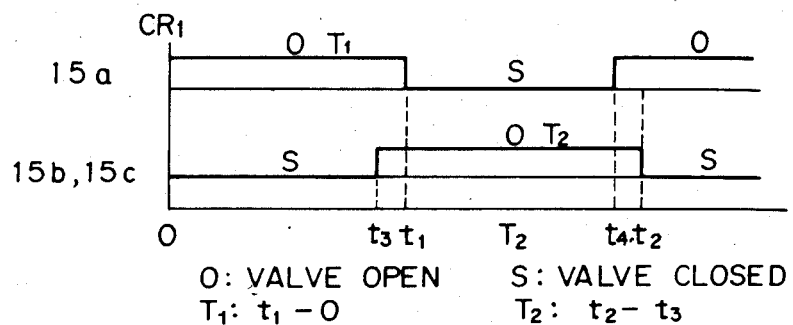
FIG. 23 is a timing chart showing the opening and closing timings of the exhaust ports of the apparatus of FIG. 21.

FIG. 23 shows an exemplary timing chart for the opening and closing functions of the exhaust ports 15-1a to 15-1c, 15-2a to 15-2c and 15-3a to 15-3c, which would obtain the most uniform effect of the plasma treatment in plasma-treating works in the plasma treatment apparatus of FIGS. 21 and 22.

In the comparable plasma treatment apparatus of FIG. 1, the plasma tends to flow within the reaction chamber 1 only in one direction from the plasma introducing port 9 toward the exhaust port 15, whereas in the plasma treatment apparatus of FIGS. 21 and 22 embodying the present invention, multiple flows of the plasma are formed in the reaction chamber according to the number and the location of the exhaust ports, and hence the works are plasma-treated uniformly regardless of the location within the reaction chamber and the configuration thereof.

Figure 24:
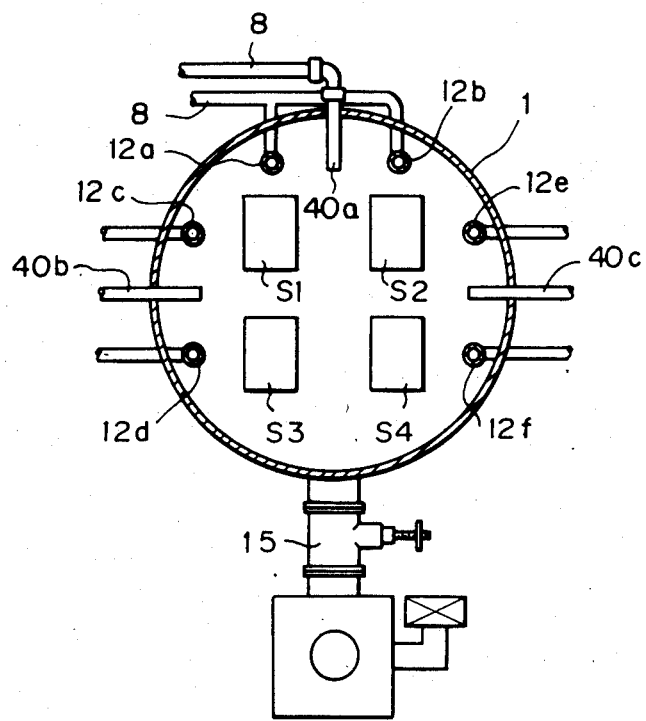
FIG. 24 is an elevational view in section of the essential part of a plasma treatment apparatus provided with shower pipes and straight pipes, embodying the present invention.
Figure 25:
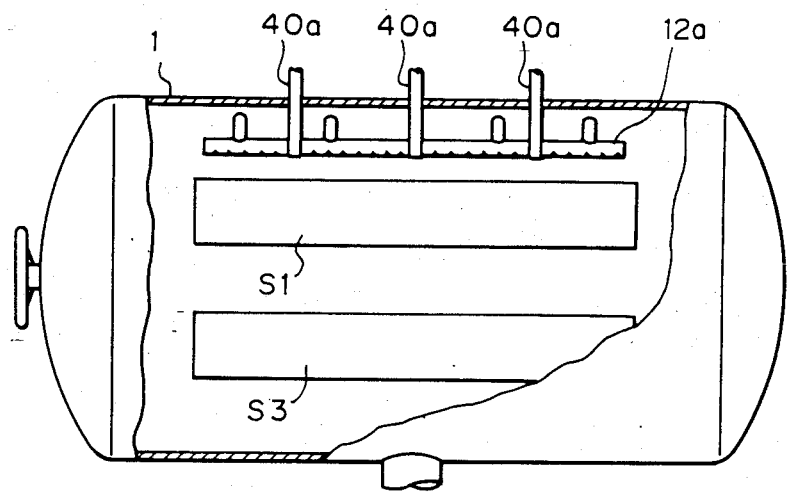
FIG. 25 is a side elevation in section of the essential part of the reaction chamber of the apparatus of FIG. 24.

FIGS. 24 and 25 show a plasma treatment apparatus also embodying this invention, which comprises a plurality of long tubular shower pipes provided along the length thereof with numerous small holes, and at least one straight pipe disposed with its free end opening toward a section to which the plasma is hard to flow (that is, toward a preselected portion of the reaction chamber which is relatively inaccessible to plasma injected from pipes 12) and the other end connected to the plasma transporting conduit. Referring to FIGS. 24 and 25, a reaction chamber 1 is provided with six plasma-irradiating pipes 12a 12b, 12c, 12d, 12e and 12f and three sets of straight pipes 40a, 40b and 40c each including three straight pipes. The plasma-irradiating pipes 12a and 12b are disposed in the upper part of the reaction chamber 1 in parallel to each other and opposite to the upper surface of works S1 and S2 respectively. The plasma-irradiating pipes 12c and 12d are disposed in the left-hand part of the reaction chamber in parallel to each other and opposite to the side surfaces of the work S1 and a work S3 respectively. The plasma-irradiating pipes 12e and 12f are disposed in the similar state in the right-hand part of the reaction chamber 1. The straiqht pipes 40a are tubular members each having a straight portion of a fixed length from the opening end thereof. The straight pipes 40a are interposed with their openings directed toward the center axis of the reaction chamber between the shower pipes 12a and 12b Three straight pipes 40a are arranged at equal intervals along the longitudinal direction of the shower pipe 12a. Other straight pipes 40b and 40c are also disposed in the same relative position with respect to the corresponding shower pipes 12c, 12d, 12e and 12f as the relative position between the straight pipes 40a and the shower pipes 12a and 12b The other end opposite the opening end of each straight pipe is connected through a plasma transporting conduit 8 to a plasma generating pipe.

Figure 26:
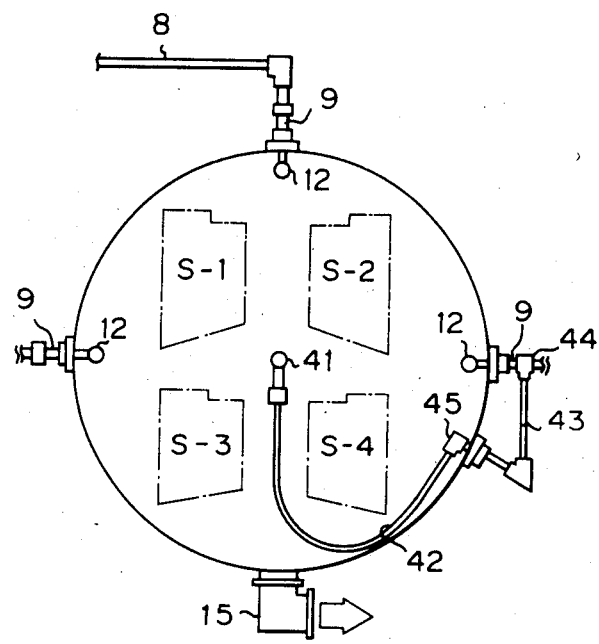
FIG. 26 is a schematic illustration of a plasma treatment apparatus provided with fixed shower pipe and movable shower pipe adapted to be moved to an optional position.
Figure 27:
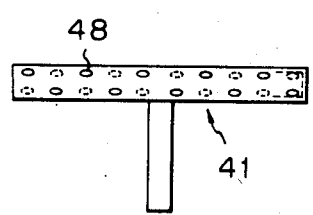
FIG. 27 and 28 are detail views of a shower pipe connected to a flexible tube.
Figure 28:
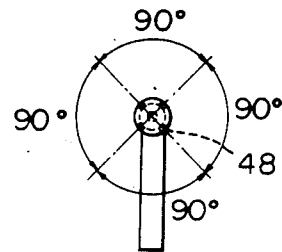
Figure 29:
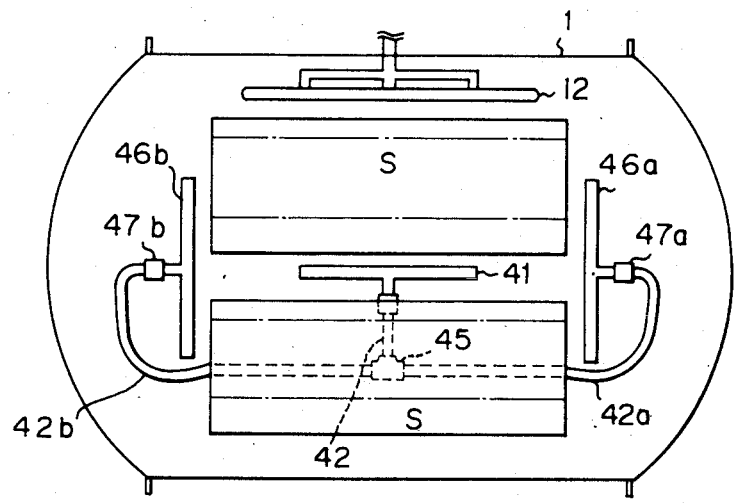
FIG. 29 is a schematic illustration of a further plasma treatment apparatus embodying the present invention, provided with a fixed shower pipe and movable shower pipes.

FIG. 26 shows a further embodiment of this invention, in which plasma-irradiating pipes 12 are fixed to the inner wall of a reaction chamber 1, while a plasma-irradiating pipe 41 is connected to a Teflon ® tube 42 so as to be located at an optional position within the reaction chamber 1. In the embodiment of FIG. 26 the plasma-irradiating pipe 41 is disposed in the central part of the cylindrical reaction chamber 1 along the axial direction of the reaction chamber 1. However, the plasma-irradiating pipe 41 can also be disposed at an optional position or inclination depending on the number, configuration and the arrangement of the works to be treated. The plasma-irradiating pipe 41 as well as the plasma-irradiating pipes 12 is made of a quartz glass pipe and is provided with many small holes serving as plasma injection nozzles 48 formed in the circumference of the wall thereof at an equal angular interval of, for example, 90° in order to radiate the plasma in all directions, as shown in FIGS. 27 and 28. A plasma transporting conduit 43 for supplying the plasma to the plasma-irradiating pipe 41 is branching off at a fluororesin connector 44. Naturally, the plasma transporting conduit 43 may branch off at any other fluororesin connector and a separate plasma generating system exclusively for the plasma-irradiating pipe 41 may be provided. Furthermore, in the embodiment of FIG. 26, a single plasma-irradiating pipe 41 is provided in the central part of the reaction chamber. However, if the works are elongated things which extend axially of the reaction chamber, and if only less effect of the plasma treatment is expected on the longitudinal ends of the works, flexible tubes 42a and 42a which are the same as the flexible tube 42 may be branched from a fluororesin connector 45 and connected to shower pipes 46a and 46b by means of fluororesin connectors 47a and 47b respectively, each shower pipe having plasma injection nozzles only in one side of the wall thereof facing the works in order to irradiate the longitudinal end portions of those works S with the plasma. Such an embodiment is shown in FIG. 29. Referring to FIG. 26, the plasma generated by a plasma generating pipe is supplied through a plasma transporting conduit 8 and fluororesin connectors to the plasma-irradiating pipes 12. Some part of the plasma is branched at a fluororesin connector 44 and is supplied through a plasma transporting conduit 43, a fluororesin connector 45 and the flexible tube 42 to the plasma-irradiating pipe 41. In the embodiment of FIG. 29, the plasma is branched further at the fluororesin connector 45 and supplied through the flexible tubes 42a and 42b and fluororesin connectors 47a and 47b to plasma-irradiating pipes 46a and 46b respectively.

As shown in FIGS. 24 and 26, the present invention may include means for generating plasma outside of reaction chamber 1, such as plasma generating tube 7; plasma introducing ports 9 along the reaction chamber wall; means for admitting plasma into the chamber from the ports, such as plasma irradiating pipes 12, linear pipes 40 (FIG. 24) and Teflon tube 42 (FIG. 26); means for channeling plasma within the reaction chamber, such as spraying head 23, distributing means (end section of pipe 40 in FIG. 24) and plasma-irradiating pipe 41 (FIG. 26); means for injecting plasma within the reaction chamber, such as nozzles 30-33, opening on end section of pipe 40 (FIG. 24) and nozzles 48 (FIG. 26); and means for exhausting the reaction chamber to regulate vacuum, such as exhaust ports 15.

In those embodiments of plasma treatment apparatus according to the present invention, the uniform distribution of the plasma density was established within the reaction chamber 1 and even in the plasma treatment of comparatively large works of complicated configuration, uniform plasma treatment over the entire surfaces of the works was attained regardless of the location and the configuration of the works. The adhesion of the paint film to the plasma-treated surfaces was satisfactory with every part of the surfaces after painting process.

Figure 30:
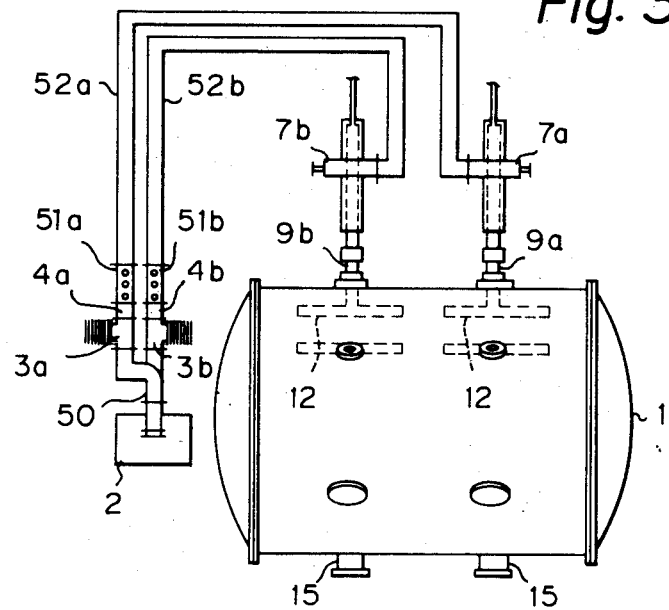
FIG. 30 is a schematic illustration of a plasma treatment apparatus embodying the present invention, in which the microwave is branched into a plurality of beams and introduced into the reaction chamber from a plurality of positions.

FIG. 30 shows a further embodiment of the present invention, in which microwaves generated by a magnetron is distributed by a distributor to a plurality of plasma generating mechanisms, each consisting of a plasma generating furnace and a plasma generating pipe, and plasma generated by the plasma generating mechanisms is introduced into a reaction chamber. Referring to FIG. 30, there are shown a microwave oscillator 2 having a built-in magnetron capable of generating microwaves, for example, of 2450 MHz, a distributor 50 formed of aluminum for 1 to 1 distribution of the microwaves, isolators 3a and 3b to restrain the reverse transmission of reflected waves to the magnetron, detecting heads 4a and 4b of a power monitor for monitoring input power and reflected power, impedance matching boxes 51a and 51b to restrict the reflected power to a minimum and waveguides 7a and 7b to transmit the microwaves to plasma generating furnaces 7a and 7b . The magnetron of the microwave oscillator 2 generates microwaves of 2450 MHz. The microwaves are distributed by the distributor 50 into two ways and are transmitted through the isolators 3a, 3b, the detecting heads 4a and 4b of the power monitor, the impedance matching boxes 51a and 52b and waveguides 52a and 52b to the plasma generating furnaces 7a and 7b . The impedance matching boxes 51a and 51b are adjusted beforehand so that the reflected power is reduced to the least degree. Input power and the reflected power are measured by the detecting heads 4a and 4b of the power monitor and the reflected power is isolated (consumed) from the system by the isolators 3a and 3b.

In the embodiment of FIG. 30, microwaves are distributed and the plasma is injected into the reaction chamber through a plurality of ports. Therefore, the distribution of the density of plasma within the reaction chamber is uniformized, and hence a plurality of large works of complicated configuration are plasma-treated uniformly. In addition, since only a reduced number of oscillators are required, the equipment investment and the power consumption are reduced by half.

Figure 31:
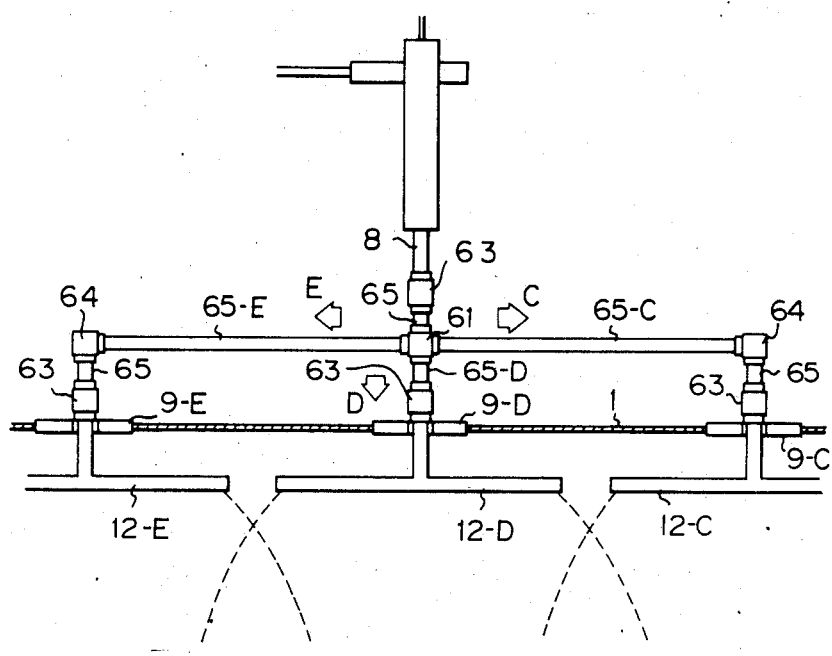
FIG. 31 is a detail view of a branching unit for branching, outside reaction chamber, the plasma into a plurality of streams to introduce the plasma from a plurality of positions.

FIG. 31 shows a further embodiment of this invention, in which the generated plasma is supplied through a plurality of branch passages and introduced through a plurality of plasma introducing ports into a reaction chamber. The plasma flows through a quartz pipe 8, a fluororesin connector 63 and a glass pipe 65 to a fluororesin cross 61. Then, the plasma flows in three ways through glass pipes 65-C, 65-D and 65-E. The plasma flows further through the glass pipes 65-C and 65-E, fluororesin 90° elbows 64, glass pipes 65 and fluororesin connectors 63 to plasma introducing ports 9-C and 9-E respectively. The plasma also flows through the glass pipe 65-D and a fluororesin connector 63 to a plasma introducing port 9-D. The plasma is injected into a reaction chamber by plasma-irradiating pipes 12-C, 12-D and 12-E connected to the plasma introducing ports 9-C, 9-D and 9-E respectively. The plasma-irradiating pipes 12-C, 12-D and 12-E are extended within the reaction chamber along the longitudinal axis of the reaction chamber. The plasma is injected through a plurality of injection nozzles (not shown) formed in the plasma-irradiatinq pipes, as illustrated by broken lines in FIG. 31.

If the respective sectional areas of the glass pipes 65-C, 65-D and 65-E are the same, most part of the plasma flows into the glass pipe 65-D and less plasma as compared with the amount of the plasma that flows into the glass pipe 65-D will flow into the glass pipes 65-C and 65-E. Therefore, such a fact must be taken into consideration in designing the inside sectional areas and the lengths of the glass pipes 65-C, 65-D and 65-E, in order to equalize the flow rates of the plasma in the glass pipes 65-C, 65-D and 65-E. Experiments showed that the appropriate relation between the sectional areas and the lengths of the glass pipes 65-C, 65-D and 65-E is represented by the following formula.

$$d_1 \cdot l_2 \div d_2 \cdot l_1^3$$

where:
$d_1$ : inside diameter of the glass pipe 65-D,
$l_1$ : length of the glass pipe 65-D,
$d_2$ : inside diameter of the glass pipe 65-C or 65-E, and
$l_2$ length of the glass pipe 65-C or 65-E.

Branching the flow of the plasma outside of the reaction chamber and introducing the plasma through a plurality of plasma introducing ports into the reaction chamber uniformized the distribution of the density of the plasma in the reaction chamber and brought about the uniform plasma treatment over the entire surface of an individual work. Employment of the plasma branching method eliminated the need of a plurality of plasma generators, reduced the cost of the equipment and brought about resource conservation.

Figure 32:
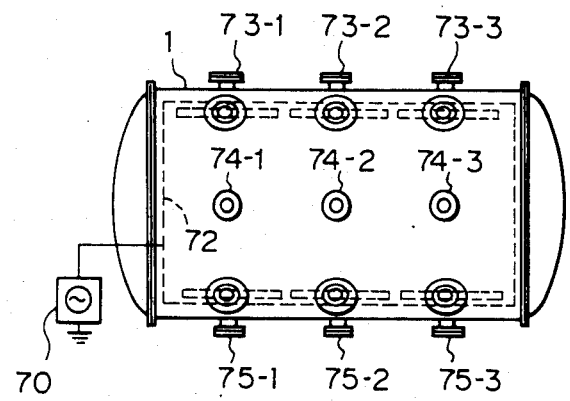
FIG. 32 is a side elevation of a plasma treatment apparatus employing both radio wave discharge plasma and microwave discharge plasma.
Figure 33:
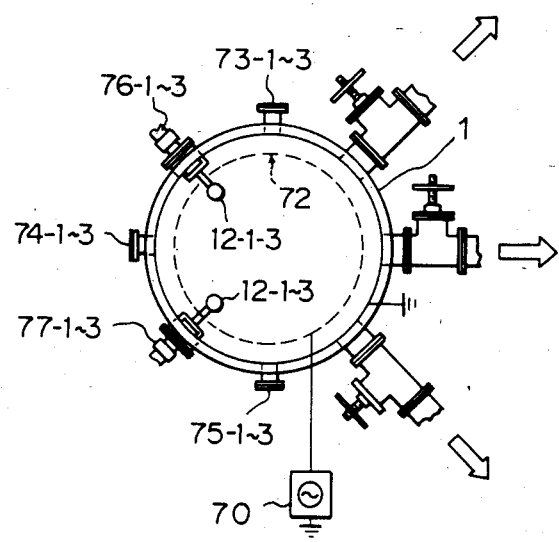
FIG. 33 is a sectional view of the apparatus of FIG. 32.

FIGS. 32 and 33 show further embodiment of this invention, in which a substantially cylindrical electrode 72 is disposed adjacently to the inner wall of a reaction chamber. The electrode 72 is connected to a radio-frequency power source 70. The electrode 72 is formed of a porous plate to allow the plasma to flow into the inside of the reaction chamber 1. Three gas inlet ports 73-1, 73-2 and 73-3 are provided in the wall of the reaction chamber 1 for supplying a gas to be converted into plasma by radio wave discharge. In the wall of the reaction chamber 1, at positions circumferentially corresponding to the gas inlet ports 73-1, 73-2 and 73-3 and separated by angular intervals of 90° therefrom, three gas inlet ports 74-1, 74-2 and 74-3 and three gas inlet ports 75-1, 75-2 and 75-3 are also provided respectively. Microwave discharge plasma introducing ports 76-1, 76-2 and 76-3, and 77-1, 77-2 and 77-3, are formed between the gas inlet ports 73-1, 73-2 and 73-3, and 74-1, 74-2 and 74-3, and between the gas inlet ports 74-1, 74-2 and 74-3, and 75-1, 75-2 and 75-3, respectively. Those plasma introducing ports 76-1 to -3 and 77-1 to -3 are connected to shower pipes 12-1, 12-2 and 12-3. Radio-frequency energy is generated between the electrode 72 disposed in the reaction chamber 1 and connected to the radio-frequency power source 70 and the grounded reaction chamber 1. While the gas, for example, oxygen gas, is introduced into the reaction chamber through the gas inlet ports 73-1, to -3, 74-1 to -3 and 75-1 to -3, and converted into radio wave discharge plasma by the radio-frequency energy. The radio wave discharge plasma thus generated functions to plasma-treat the surfaces of works placed adjacently to the electrode 72 disposed in the reaction chamber, namely the general surfaces of the works. The plasma introduced into the reaction chamber 1 through the plasma introducing ports 76-1 to -3 and 77-1 to -3 injected to the plasma-irradiating pipes 12-1 to -3. This plasma functions to plasma-treat the portions of the surfaces which are plasma-treated insufficiently by the radio wave discharge plasma, namely, the portions which are situated far from the electrode 72 disposed in the reaction chamber 1 or the portions which are screened by the works from the radio wave discharge plasma. The plasma treatment of works by means of this embodiment employing both the radio wave and microwave discharge plasmas reduced variation in the effect of plasma treatment between the works and within the individual works. In the experimental plasma treatment using this embodiment, the works were first subjected to radio wave discharge plasma treatment, and then to microwave discharge plasma treatment. However, the same effect would be attainable even if the plasma treatment processes were reversed or both the radio wave and microwave discharge plasma treatment were carried out simultaneously.

Figure 34:
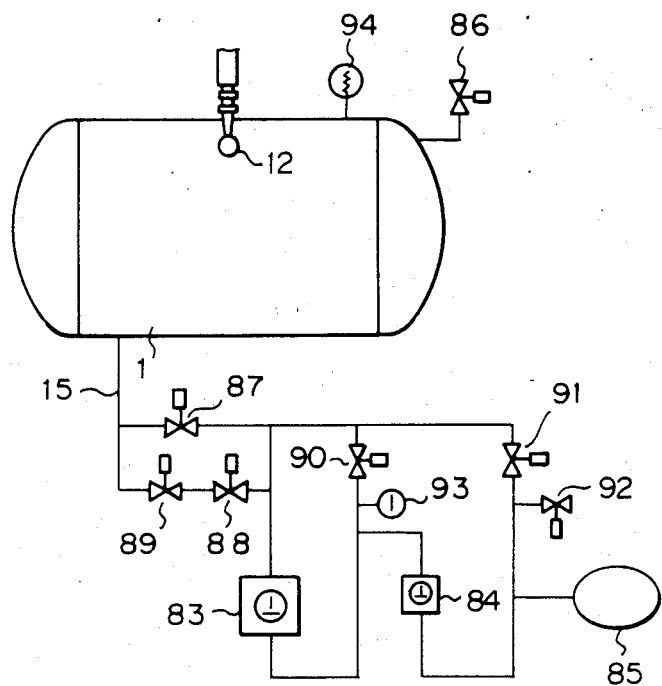
FIG. 34 is a schematic illustration of a plasma treatment apparatus in which the reaction chamber is evacuated by the combined action of a hydraulic pump and a mechanical booster pump.

Now, in connection with FIGS. 34, a plasma treatment process characterized by evacuating the reaction chamber through the combined function of hydraulic and mechanical booster pumps will be described hereinafter.

The constitution of the pump system for evacuating a reaction chamber 1 will be described hereunder. An exhaust duct 15 is attached to the bottom of the reaction chamber 1 to interconnect the latter to vacuum pumps. The pump system includes a mechanical booster pump 83, of 2000 m$^3$/hr discharge capacity, 10 Torr maximum suction pressure and 5×10$^4$ Torr ultimate pressure, and another mechanical booster pump 84, of 600 m$^3$/hr discharge capacity, 100 Torr maximum suction pressure and 2 Torr ultimate pressure. In the piping interconnecting the reaction chamber with the vacuum pumps, a main control valve 87, a control valve 88 for setting a vacuum pressure and a manual control valve 89 are provided. In FIG. 34, indicated at 90, 91 and 92 are vacuum valves for adjusting by-pass circuits, indicated at 93 is a vacuum pressure switch capable of providing a signal upon pressure detection, and indicated at 94 is a two-point type Pirani gauge. The pump system also employs a hydraulic pump 85, of 600 m$^3$/hr discharge capacity and 17 Torr ultimate pressure (at 15° C water temperature).

Figure 35:
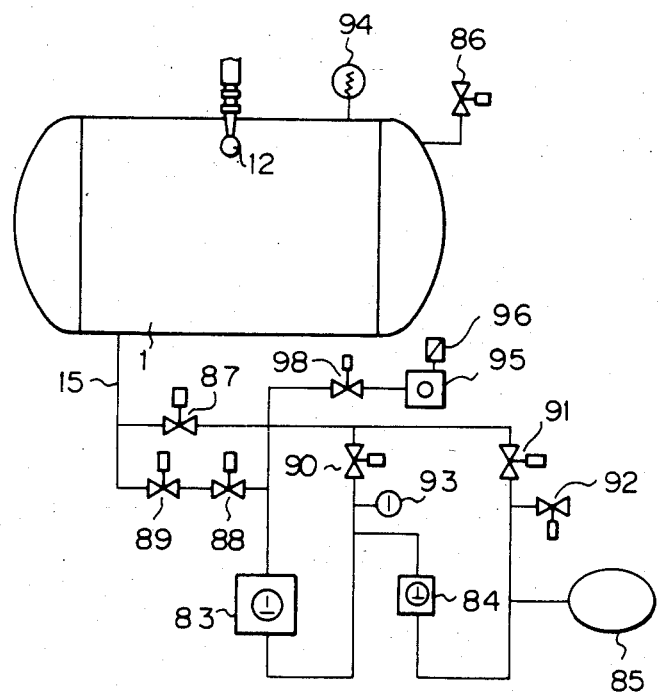
FIG. 35 is a schematic illustration of a plasma treatment apparatus in which the reaction chamber is evacuated by the combined action of a hydraulic pump, an oil rotary pump and a mechanical booster pump.

FIG. 35 shows an embodiment of the present invention, which employs a pump system comprising a hydraulic pump, an oil rotary pump and a mechanical booster pump for evacuating the reaction chamber cooperatively. Namely, the pump system includes, in addition to a hydraulic pump 85, an oil rotary pump 95, of 400 m³/hr discharge capacity, $5 \times 10^{-3}$ Torr ultimate pressure and 11 kW rated power, having an oil mist trap 96.

Figure 36:
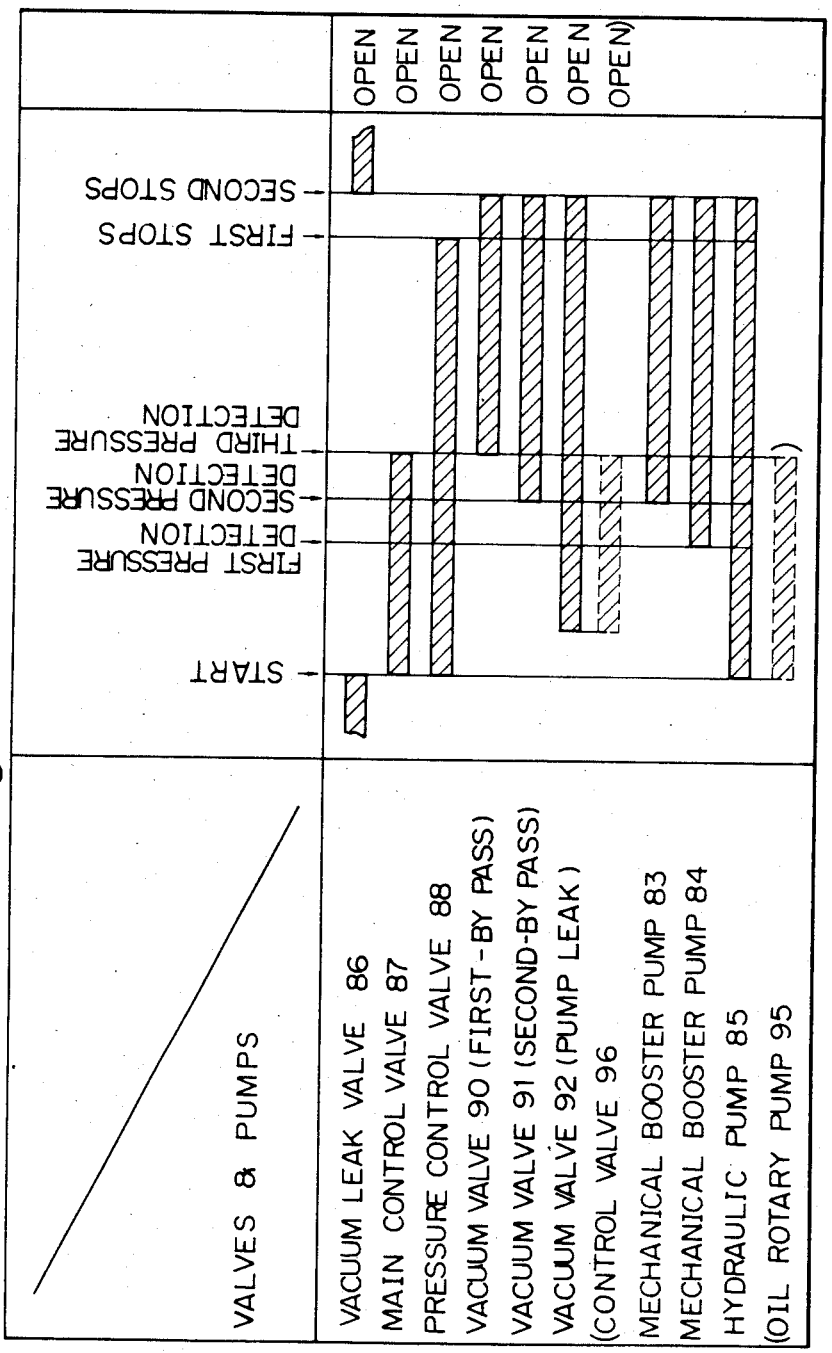
FIG. 36 is timing chart of the evacuating process for carrying out the method of the present invention employing the plasma treatment apparatus of FIG. 34 (or 35).

The evacuating process of the reaction chamber in those embodiments will be described in connection with a timing chart shown in FIG. 36.

First the door, not shown, of the reaction chamber 1 is closed, then the vacuum leak valve 86 is closed, and then the evacuating system is actuated. The main control valve 87 and the control valve 88 open and at the same time, the hydraulic pump 85 (and the oil rotary pump 95, in the case of the pump system of FIG. 35) starts operating. After a predetermined time, the vacuum valve 92 closes and the internal pressure of the reaction chamber begins reducing. Upon the detection of a predetermined pressure of 100 Torr (first pressure detection), the vacuum pressure switch 93 provides a signal to actuate the mechanical booster pump 84. Then, upon detection of a pressure of 100 Torr (second pressure detection), the two-point type Pirani gauge 94 (the Pirani gauge is set beforehand for 100 Torr and 0.01 Torr) provides a relay signal to actuate the mechanical booster pump 83, and then the vacuum valve 91 closes. Upon detection of a pressure of 0.01 Torr, (third pressure detection) by the Pirani gauge 94, the vacuum valve 90 and the main control valve 87 close. In the case of the pump system of FIG. 35, the control valve 98 closes simultaneously and the oil rotary pump 95 stops. Consequently, the gas flows only through the line including the control valve 88. Since the vacuum valves 90 and 91 (and the control valve 98, in the case of FIG. 35) have been closed, the gas does not flow through the by-pass line (and the line including the oil rotary pump, in the case of FIG. 35), and thereby a series of flow through the pumps 83, 84 and 85 is established. Upon detection of a pressure 0.01 Torr, the Pirani gauge provides a pressure signal to supply oxygen gas into the reaction chamber 1. The oxygen gas supplied into the reaction chamber 1 flows together with the series of flow through the pumps 83, 84 and 85 and contacts with water in the hydraulic pump 85 and is, finally, discharged into the atmosphere. By a previous adjustment of the degree of opening of the manual control valve 89, a predetermined vacuum pressure can be set for plasma treatment under a predetermined gas supply rate.

Upon the supply of oxygen gas, after the predetermined vacuum pressure is established in the reaction chamber, microwaves are generated to convert the oxygen gas into plasma to plasma-treat the surfaces of works placed in the reaction chamber. After completion of the plasma treatment process, first the pressure control valve 88 is closed (first stop), while the interiors of the pumps are maintained in a vacuum state and after a predetermined period of time, all the vacuum pumps are stopped (second stop). After the vacuum pumps have been stopped, the vacuum leak valve 86 is opened to restore the atmospheric pressure in the reaction chamber 1, thus completing a cycle of a series of plasma treatment process.

During the reaction chamber evacuating process, since the water that flows within the hydraulic pump is always cooled to maintain the discharging performance of the pump, there is no possibility that the temperature of the water rises due to the rotation of the rotor, and hence the oxygen gas discharging process entails no possibility of ignition. Furthermore, the evacuating process is completed within an extremely short period of time. By reforming the surface of the resin parts through plasma treatment, with appropriate plasma introducing rate and duration with respect to the volume of the reaction chamber, a satisfactory adhesion of the paint film will be brought about, which will hardly cause the peeling of the paint film.

Satisfactory results of plasma treatment are obtained when the interior of the reaction chamber is maintained in a vacuum state of 100 Torr or less, preferably, 0.1 to 10 Torr, at least during the radiation of the plasma and the relation between the volume V (l) of the reaction chamber, the plasma introducing rate Q (l/sec) and the duration of plasma radiation t (sec) meets the following inequality:

$$0.00025 \leq \frac{Q \cdot t}{V} \leq 0.01$$

In order to generate low-temperature plasma, it is preferable to employ microwave discharge, the output of the microwave discharge being 100 to 1400 W, preferably, 400 to 1200 W.

We claim:

1. An apparatus for plasma-treating works of resin material by irradiating the surfaces of the works with a microwave discharge plasma within a vacuum reaction chamber having an inner wall, comprising at least one first plasma-irradiating pipe fixed to the inner wall of the reaction chamber, said first plasma-irradiating pipe being provided with numerous small holes distributed along the length of said pipes, the distribution of said nozzle holes having a predetermined angular configuration within 7.5° to 45° along the length of said tubular pipes, and at least one second plasma-irradiating pipe formed of flexible material and having a free end, wherein said second plasma-irradiating pipe is movable so that said free end may be adjusted to an optional position within the reaction chamber.

2. The apparatus according to claim 1, also including at least one third plasma-irradiating pipe having a linear configuration and an exposed end, wherein said exposed end includes injecting means for directing plasma toward a preselected portion of the reaction chamber which is relatively inaccessible to plasma injected from said first and second plasma irradiating pipes.

3. An apparatus according to claim 1, wherein the second plasma-irradiating pipe is connected to a plasma introducing port via a flexible tube.

4. An apparatus according to claim 1 or 3, wherein the second plasma-irradiating pipe consists of a cylindrical pipe having numerous small plasma-injecting holes provided over the entire periphery of the pipe so as to irradiate plasma in various radial directions with respect to the center axis of the cylindrical pipe.

5. An apparatus for plasma treatment of objects formed of resin material, comprising:
 a reaction chamber for receiving said objects having a wall with a plurality of ports;
 means for generating microwave discharge plasma outside of said chamber, said generating means being connected to said ports;
 means for admitting said plasma into said chamber from said ports including a conduit rigidly mounted on the inner wall of said chamber and a first pipe formed of flexible material having a first end affixed to one of said ports, said first pipe having a second end adjustably positioned within said chamber, said admitting means isolating said plasma from said chamber wall;

means for channeling plasma within said chamber connected to said admitting means and including an elongated tubular second pipe connected to said conduit and facing the interior of said chamber, said channeling means also including distributing means connected to said first pipe, said channeling means thereby maintaining said channeled plasma isolated from said chamber wall; and means for injecting plasma within said reaction chamber including a plurality of individual nozzle holes distributed along the length of said second pipe, the distribution of said nozzle holes having a predetermined angular configuration within 7.5° to 45° along the length of said second pipe, said injecting means also including a plurality of nozzle holes surrounding the periphery of said distributing means for releasing plasma in various discrete flow directions within said chamber;

means for exhausting said reaction chamber to regulate vacuum therein.

6. The apparatus according to claim 5, wherein the distribution of said nozzle holes on said tubular pipe is within 30° to 60° along the length of said second pipe.

7. The apparatus according to claim 5, wherein said admitting means includes a linear third pipe attached to one of said ports, said third pipe having an exposed end for directing plasma toward a preselected portion of the reaction chamber which is relatively inaccessible to plasma injected from said first and second pipes.

8. An apparatus for plasma treatment of materials of substantially three dimensional objects formed of resin material, comprising:

a reaction chamber for receiving said objects having a wall with at least two ports;

means for generating microwave discharge plasma outside of said chamber, said generating means being connected to said ports;

at least one first plasma-irradiating pipe positioned within said chamber for injecting plasma therein and having a portion facing the interior of said chamber, said at least one first plasma irradiating pipe being interconnected with at least one of said ports and receiving plasma from said generating means, said portion of said first plasma-irradiating pipe having numerous holes distributed along the length of said pipes, the distribution of said nozzle holes having a predetermined angular configuration within 7.5° to 45° along the length of said tubular pipes; and means for directing plasma within said chamber at locations relatively inaccessible to plasma released through said pipe means, said directing means comprising at least one second plasma-irradiating pipe, said second plasma-irradiating pipe being formed of flexible material and including a first end and a second end, wherein said first end connected to one of said ports, and wherein said second end is adjustably positioned within said chamber.

9. The apparatus according to claim 8, wherein said directing means includes at least one linear pipe having an end attached to one of sid posts and an exposed end directed toward a preselected portion of the reaction chamber.

* * * * *